United States Patent [19]

August et al.

[11] 4,350,916

[45] Sep. 21, 1982

[54] SURFACE ACOUSTIC WAVE DEVICE HAVING BURIED TRANSDUCER

[75] Inventors: Rudolf R. August, Laguna Beach; Dean B. Anderson, Whittier; Shi-Kay Yao, Anaheim, all of Calif.

[73] Assignee: Rockwell International Corporation, El Segundo, Calif.

[21] Appl. No.: 163,533

[22] Filed: Jun. 27, 1980

[51] Int. Cl.³ ............................................. H03H 9/32
[52] U.S. Cl. .............................. 310/313 B; 333/153; 333/154; 358/213
[58] Field of Search ............... 310/313 B, 313 C, 364; 333/153, 154, 155, 193, 194, 195, 196; 331/107 A; 364/819, 821; 358/213; 357/26

[56] References Cited

U.S. PATENT DOCUMENTS

| | | | |
|---|---|---|---|
| 3,825,779 | 7/1974 | de Klerk | 310/313 B |
| 3,955,160 | 5/1976 | Duffy | 333/155 |
| 4,025,954 | 5/1977 | Bert | 358/213 |
| 4,037,176 | 7/1977 | Ono et al. | 333/155 |

OTHER PUBLICATIONS

A. Armstrong et al., "High Coupling Efficiency for ZnO Overlays on Lithium Niobate", IEEE, 1972, *Symposium on Sonics and Ultrasonics*.
Y. Shimizu et al., "Unidirectional S.A.W. Transducers with a ZnO Film on Glass Substrate", *Electronics Letters*, 23 Jun. 77, vol. 13, No. 13, p. 384.
G. S. Kino et al., "Theory of Interdigital Couplers on Non-piezoelectric Substrates", *JAP*, Apr. '73, vol. 44, No. 4, p. 1480.
S. K. Yao, "Guided-Wave acousto-Optical Devices on Si", *Soc. of Photo-Optical Instrumentation Engr.* 27 Aug. '79, vol. 202, pp. 90-95.

*Primary Examiner*—J. D. Miller
*Assistant Examiner*—D. L. Rebsch
*Attorney, Agent, or Firm*—H. Fredrick Hamann; Gilbert H. Friedman

[57] ABSTRACT

An acoustic wave device wherein each electrode element of an interdigital transducer is buried or embedded between a pair of layers of piezoelectric material. The use of a multi-layer stack of layers of piezoelectric material enables each electrode element of the transducer to be sandwiched between a distinct pair of layers and thus to be insulated from the other electrode element or elements. Because of the insulation thus provided, the spacing between the fingers of each electrode element may be selected without fear of causing short circuits between electrode elements.

18 Claims, 9 Drawing Figures

SURFACE ACOUSTIC WAVE DEVICE HAVING BURIED TRANSDUCER

BACKGROUND OF THE INVENTION

1. Field of the Invention

This invention relates to structural improvements for acoustic wave devices.

2. Description of the Prior Art

The interdigital type of electromechanical transducer is used frequently in surface acoustic wave devices. Such a transducer typically comprises a pair of electrodes formed on an outer surface of a body of piezoelectric material. Each electrode has a plurality of spaced-apart fingers which extend toward the other electrode across the path for propagation of the surface acoustic waves. The fingers of one electrode are typically interdigitated or alternated with the fingers of the other electrode along the surface acoustic wave propagation path.

The spacing between the fingers of each electrode of the transducer typically has a uniform or constant periodicity. In addition, the periodicity of the spacing of the two sets of fingers is the same. If this were not so, there would be a tendency for fingers of one electrode to contact fingers of the other electrode, creating a short circuit between the two electrodes. In the usual case, each electrode finger is positioned to be equidistant from its two nearest neighbor fingers of the other electrode. It may be said that this symmetrical positioning provides a constant phase displacement between the two sets of fingers of 180 degrees. In this case, where the electrode fingers are symmetrically positioned, the coupling between the electrical fields and the acoustic waves becomes synchronous and therefore very strong when the signal frequency is such that the center-to-center spacing between adjacent electrode fingers is one-half of an acoustic wavelength.

It is very desirable that an acoustic wave device have low insertion loss. High insertion loss is disadvantageous because it is accompanied by a requirement for correspondingly high power consumption in the signal driver and signal detector for the device. However, the surface acoustic wave devices using interdigital transducers which have been heretofore available have had insertion losses higher than is desirable. When ways are found to make these insertion losses lower, as in the invention disclosed hereinafter, many additional applications will be found for these devices.

In the typical embodiments of the prior art, surface acoustic wave devices having interdigital transducers formed on a surface of a substrate of piezoelectric material are operated in air. The transducer is therefore exposed to air on one side. This operation in air is one of the reasons for the occurrence of relatively high insertion loss. This is because the air surrounding the outer half of the transducer is not piezoelectrically active and therefore does not contribute to the coupling between electrical and mechanical activities. Stated alternatively, since part of the electrical energy stored in the capacitor formed by the transducer electrodes is stored in air, that part of the electrical energy is not involved in and does not contribute to electromechanical coupling. It follows that the efficiency of the associated electrical-mechanical energy conversion is correspondingly low. In addition, the power handling capacity for a surface acoustic wave device operated in air is relatively low and limited because the largest electric field intensity which can be induced without causing dielectric breakdown and arcing in the air is relatively low.

The prior art interdigital transducers described above are bidirectional. When these transducers are appropriately energized by electrical signals, redundant surface acoustic waves are excited to propagate in both opposing directions along the propagation path on the piezoelectric material. The propagation path for the waves extends in a direction perpendicular to the transducer electrode fingers. In the typical situation, only one of the two counter-propagating waves thus excited is of interest. The energy of the other wave is expended and wasted in an acoustic energy absorber. This energy waste is another cause of the undesirably high insertion loss of prior-art acoustic wave devices.

It is apparent that the high energy loss due to the bidirectionality of the typical interdigital transducer could be reduced or even eliminated if the transducer were made to launch surface acoustic waves unidirectionally. It is known that wide-band unidirectionality can be achieved, in theory, by using, for example, three or four sets of electrode fingers driven by an appropriate multiple-phase alternating signal. Attempts have been made to fabricate multiple-phase unidirectional interdigital transducers by designing each electrode finger to be much narrower or thinner than is otherwise customary. The neighboring transducer fingers can then be positioned closer to each other than one-half of an acoustic wavelength. The phase displacement between neighboring transducer fingers is then less than 180 degrees. More than two of such fingers can be disposed per acoustic wavelength. When this is done, three or four electrodes, for example, can be disposed for synchronous multiple-phase driving.

However, it has proved to be difficult to implement such a multiple-phase surface acoustic wave transducer where the three or four electrodes are disposed primarily on a single surface. In order to avoid short circuits between overlapping parts of different electrodes, portions of the fingers of at least one electrode must be elevated over at least one other electrode. Such a transducer is expensive to fabricate. In addition, the unsupported structure of the elevated portion of the transducer is somewhat delicate and the fabrication process is therefore likely to have a low yield.

Regardless of considerations of directionality, it is sometimes desirable to propagate surface acoustic waves on a substrate of conductor or semiconductor material. However, when surface acoustic wave transducer electrodes are deposited directly on such a substrate, the substrate will tend to short-circuit the electrodes and thus impair the operation of the transducer. Even in cases where the surface of the conductor or semiconductor substrate has been oxidized to provide a layer of dielectric material thereon, that layer is typically very thin. Thus there remains strong capacitive coupling between the transducer electrodes and the substrate. This coupling keeps the loading on the transducer high and the electromechanical energy conversion efficiency low.

SUMMARY OF THE INVENTION

By means of this invention, the above-noted shortcomings of the prior-art are overcome, and there is provided a surface acoustic wave device having enhanced electromechanical energy conversion efficiency.

In a preferred embodiment of this invention, there is provided a surface acoustic wave device having a plurality of layers of piezoelectric material disposed on a substrate, the layers being stacked on each other. Each electrode of an interdigital transducer for acoustic waves is sandwiched or buried between a pair of the layers. Thus, each electrode is surrounded by relatively high-dielectric-constant piezoelectric material. The electromechanical energy conversion efficiency is thereby significantly increased over the case where the fields on the outer side of a surface acoustic wave transducer are in air.

Furthermore, in a surface acoustic wave device in accord with the invention, an electrode for a surface acoustic wave transducer may be buried or interposed alone between a pair of the layers of piezoelectric material. Thus the electrodes as well as the layers may have a stacked relationship. With this structure, the phase displacement between the fingers of different electrodes may be made as small as desired and the fingers may be made to overlap each other without coming into contact with each other regardless of the width of a finger. Short circuits are avoided since electrodes which would otherwise be overlapping are insulated from each other by the piezoelectric material. In this case, the phase displacement between the fingers of the transducer electrodes may be selected to produce a desired result such as, for example, unidirectional launching of surface acoustic waves. Where three or more electrodes are disposed to form a unidirectional multiple-phase transducer, there will be no fragile unsupported structure as in the prior-art since each of the several electrodes will be fully supported between piezoelectric layers of material. The electromechanical energy conversion efficiency of such a unidirectional structure is significantly increased since no energy is wasted in launching a second redundant acoustic wave.

A surface acoustic wave device having a high electromechanical energy conversion efficiency may be readily formed in accord with the invention on a conductor or semiconductor substrate. At least one layer of piezoelectric material serves to insulate the transducer from the substrate. That layer may be made thick enough to minimize the effects of capacitive coupling.

Accordingly, it is an object of this invention to provide a surface acoustic wave device having enhanced transducer electromechanical energy conversion efficiency.

Another object of the invention is the provision of a surface acoustic wave device wherein the phase displacement of fingers of transducer electrodes may be selected to have any desired value without causing contact and short-circuiting of the electrodes.

Still another object of the invention is to provide a surface acoustic wave device wherein the spacing between the fingers of each transducer electrode may be selected according to any desired pattern without causing contact and short-circuiting of the electrodes.

A further object of the invention is to provide a surface acoustic wave transducer of high electromechanical energy conversion efficiency on a conductor or semiconductor substrate.

A still further object of the invention is to provide a surface acoustic wave device wherein the energy of the electric fields associated with the surface acoustic wave transducer is stored primarily in solid dielectric material.

Another object of the invention is to provide readily fabricated unidirectional surface acoustic wave transducers.

Yet another object of the invention is to provide a rugged and readily fabricated, multiple-phase unidirectional surface acoustic wave transducer.

DESCRIPTION OF THE PREFERRED EMBODIMENTS

Figure 1:
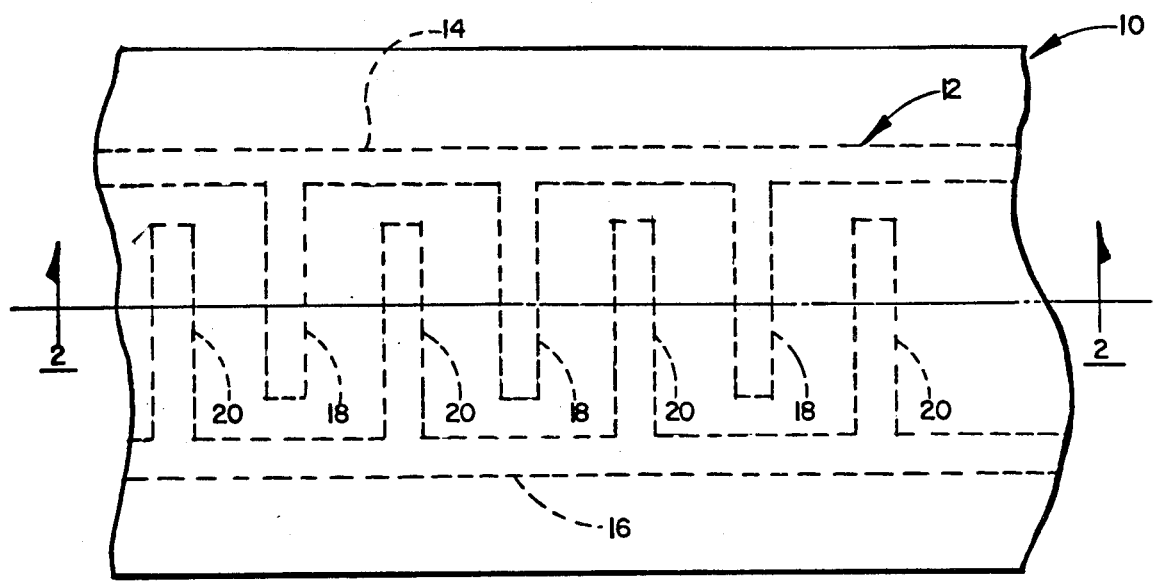
FIG. 1 is a plan view of a portion of a typical surface acoustic wave device in accord with the invention.

Referring now to FIG. 1, there is shown a broken-away portion of a surface acoustic wave device 10 having associated therewith an interdigital transducer indicated generally at 12. The interdigital transducer 12 includes a pair of electrodes 14 and 16. Electrode 14 has a plurality of spaced-apart fingers 18 interdigitated or alternated with the plurality of spaced-apart fingers 20 of electrode 16. Each set of the fingers 18 and 20 extends toward the other electrode, 16 and 14, respectively, across and perpendicular to the path for propagation of surface acoustic waves.

The spacing between the electrode fingers 18 has a uniform or constant periodicity while the spacing between the electrode fingers 20 has the same uniform periodicity. Furthermore, each of the set of fingers 18 is symmetrically positioned to be equidistant from its two nearest neighbors in the set of fingers 20. Thus, the phase displacement between the two sets of fingers 18 and 20 is constant at 180 degrees.

Figure 2:
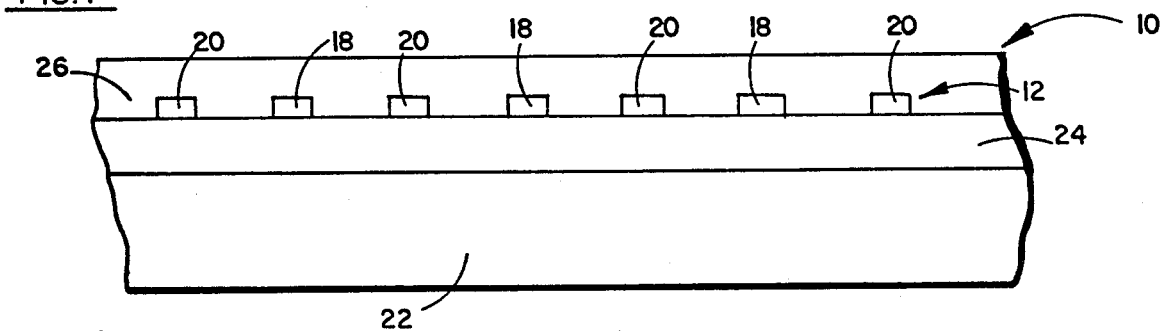
FIG. 2 is a cross-section view in elevation of the surface acoustic wave device of FIG. 1 showing an embedded or buried interdigital transducer.

FIG. 2 is a cross-section view of the surface acoustic wave device 10 of FIG. 1 taken along the line 2—2 of FIG. 1 and looking in the direction of the arrows. Surface acoustic wave device 10 includes a substrate 22 and a layer of piezoelectric material 24 disposed on the substrate 22. The interdigital transducer 12 having the set of electrode fingers 18 interdigitated with the set of electrode fingers 20 is disposed on the layer 24. Both the layer 24 and the interdigital transducer 12 are covered by a second layer of piezoelectric material 26. Thus, the pair of layers of piezoelectric material are formed in a stack while the entire transducer 12 is interposed or buried between them. This is the major difference between the transducer 12 and the typical interdigital transducer of the prior art. Each of the electrodes 14 and 16 of transducer 12 is surrounded by piezoelectric material. This piezoelectric material has a higher dielectric constant than air. Therefore, almost all of the electrical energy which is stored in the capacitor formed by electrodes 14 and 16 is stored in the piezoelectric material. The result is that there is close and strong coupling between the electrical and mechanical processes. Therefore, the electromechanical energy conversion efficiency of surface acoustic wave device 10 is significantly higher than prior-art devices having the transducer on an outer surface of a body of piezoelectric material and wherein the device is operated in air. The insertion loss of the surface acoustic device 10 is, therefore, significantly lower than that of these prior-art devices.

The electrical-mechanical interaction in the surface acoustic wave device 10 occurs between the piezoelectric material in layers 24 and 26 and the transducer 12. Therefore, the substrate 22 need not be of piezoelectric material. In the preferred embodiment, the substrate 22 is of any suitable material. As examples, the substrate 22 may be made from a dielectric material such as glass, from a semiconductor material such as silicon, from a plastic material or from metal. This feature of the invention makes it much easier and cheaper to fabricate than the prior-art type of surface acoustic wave device which is required to be formed on a substrate cut from a single crystal of piezoelectric material. The wide choice available for substrate materials greatly expands the applications for surface acoustic wave devices. When the substrate 22 is of conductor or semiconductor material, the layer 24 serves to insulate the transducer 12 from the substrate 22. This helps to avoid the difficulties encountered when the transducer is disposed directly on the substrate, as discussed above.

Each of layers 24 and 26 are of any suitable piezoelectric material such as, for example, zinc oxide, cadmium sulfide, zinc sulfide, lead-zirconium-titanate (PZT) or polyvinyladine fluoride (PVF$_2$). Thin films of piezoelectric zinc oxide deposited by sputtering or evaporation are preferred. Smith, Jr. et al, "Deposition of Ordered Crystalline Films", U.S. Pat. No. 4,297,189 issued Oct. 27, 1981, and filed concurrent herewith, and assigned to Rockwell International Corporation, the assignee herein, is hereby incorporated by reference into the present disclosure for the purpose of teaching procedures and apparatus for consistently depositing high quality films of piezoelectric zinc oxide.

The electrodes 14 and 16 of the transducer 12 are preferably formed of metal by fine-line lithographic techniques.

Figure 3:
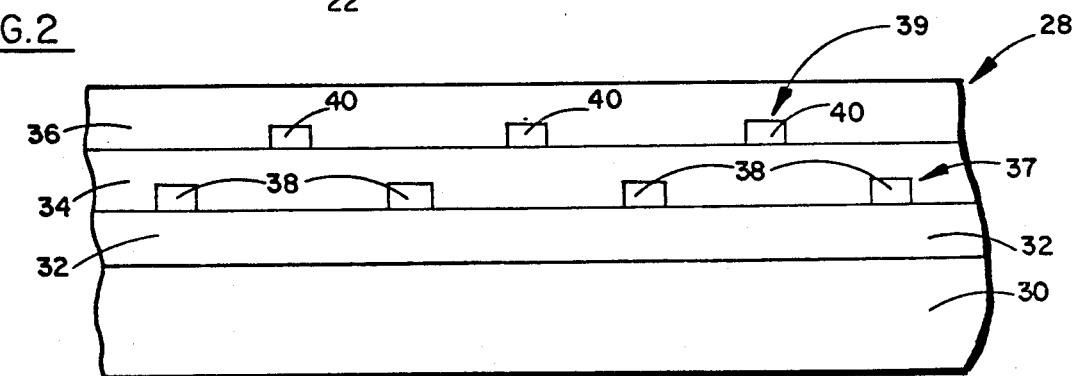
FIG. 3 is a cross-section view in elevation of a portion of a surface acoustic wave device wherein the respective electrodes of an interdigital transducer are interposed between different pairs of layers of piezoelectric material.

FIG. 3 shows a surface acoustic wave device 28 which includes a substrate 30 and a stack of three layers, 32, 34 and 36 of piezoelectric material. An interdigital transducer is formed by a first electrode 37 having fingers 38 and a second electrode 39 having fingers 40. The first electrode 37 is embedded between the pair of layers 32 and 34 while the second electrode 39 is embedded between the pair of layers 34 and 36. The two transducer electrodes 37 and 39 are therefore positioned in a stack, one above the other.

The spacing of the fingers 38 of the first electrode 37 has the same constant periodicity as the spacing of the fingers 40 of the second electrode 39. Furthermore, since the two sets of fingers 38 and 40 are symmetrically positioned relative to each other, the phase displacement between the two sets of electrode fingers is 180 degrees. For these reasons, the interdigital transducer and the acoustic wave device 28 provide performance which is quite similar to that of the transducer 12 and acoustic wave device 10 of FIGS. 1 and 2.

Figure 4:
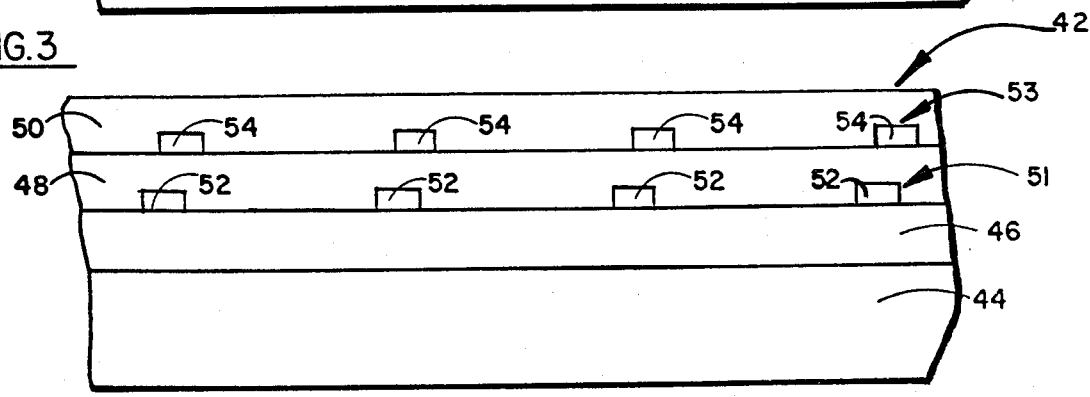
FIG. 4 is a cross-section view in elevation of a portion of a surface acoustic wave device in accord with the invention wherein the fingers of the respective electrodes of an interdigital transducer overlap each other.

The surface acoustic wave device 42 of FIG. 4 resembles the device 28 of FIG. 3 in that it includes a substrate 44 on which are stacked, one above the other, three layers, 46, 48 and 50, of piezoelectric material. An interdigital transducer is formed by a first electrode 51 having fingers 52 and a second electrode 53 having fingers 54. The first electrode 51 is sandwiched between the pair of layers 46 and 48 while the second electrode 53 is sandwiched between the pair of layers 48 and 50. The two transducer electrodes 51 and 53 are thus also positioned in a stack, one above the other. In addition, the spacing of the fingers 52 of the first electrode 51 has the same constant periodicity as the spacing of the fingers 54 of the second electrode 53. To this extent, the interdigital transducer of acoustic wave device 42 is similar to the transducer of the acoustic wave device 28 of FIG. 3. However, there is an important difference between the transducers of acoustic wave devices 28 and 42. Because the invention permits stacking of transducer electrodes and also provides insulation between the stacked electrodes, the two sets of electrode fingers 52 and 54 may be positioned, as shown in FIG. 4, to have such a small phase displacement between them that the fingers 52 overlap the fingers 54. The precise amount of phase displacement may be selected to provide any transducer characteristic which is obtainable by selecting a specific phase displacement such as, for example, unidirectional operation. It will be apparent to those skilled in the art that the phase displacement may even be selected to be zero in which case one set of electrode fingers will be directly above the other. This may be said to be a case of complete overlap, forming the so-called window-frame type of device.

Figure 5:
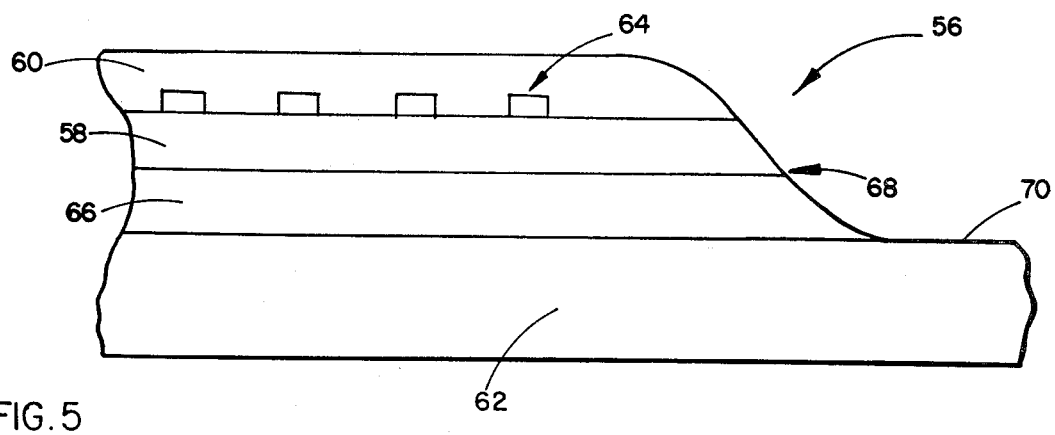
FIG. 5 is a cross-section view in elevation of a portion of a surface acoustic wave device similar to that shown in FIGS. 1 and 2 having an isolation layer on the substrate.

The acoustic wave device 56 of FIG. 5 is similar to acoustic wave device 10 shown in FIGS. 1 and 2. A pair of layers, 58 and 60, of piezoelectric material are stacked one above the other and on a substrate 62. An entire interdigital transducer 64 with electrode fingers having uniform periodicity and symmetrical placement is buried between layers 58 and 60. However, acoustic wave device 56 differs from acoustic wave device 10 in that a layer 66 of a non-piezoelectric insulating material is interposed between the layers 58 and 60 of piezoelectric material and the substrate 62. The layer 66 may be formed of any suitable non-piezoelectric insulative material such as, for example, silicon oxide or glass. It is preferable to insert such a layer 66 for isolation between the piezoelectric layers 58 and 60 and the substrate 62 when the substrate 62 is of semiconductor material or metal. Otherwise, the electrical losses due to currents induced to flow in the substrate by the electric fields will tend to degrade the performance of the device 56 by increasing insertion losses.

FIG. 5 illustrates another aspect of the invention in that it shows a smooth, tapered transition region 68 at the edge of the stack of layers 58, 60 and 66. The edge of the stack of layers 58, 60 and 66 is tapered to permit acoustic waves launched by transducer 64 to emerge from the stack without reflection and to travel along the top surface 70 of the substrate 62. Similarly, acoustic waves traveling along the top surface 70 of the substrate 62 from another source or from a reflecting discontinuity may enter the stack of layers 58, 60 and 66 by way of transition region 68 and be sensed by transducer 64. Such a transition region may be readily formed by lithographic techniques, for example, or by depositing the material of layers 58, 60 and 66 through a shadow mask.

Of course, the embodiment 56 of FIG. 5 is given by way of example only. In many applications, it may be preferable to cover the entire substrate with the layers of piezoelectric material and, where desired, with the isolation layer.

As is the case with other surface acoustic wave devices, surface acoustic wave device 56 of FIG. 5 is useful in signal processing applications. However, because it is fabricated by the deposition of piezoelectric material on a substrate which may be any one of a variety of materials, it may be fabricated on artifacts which have utilities other than in signal processing. For example, the substrate 62 may be, for example, an engine-mount pylon for an airplane. The surface acoustic wave device 68 may be fabricated on the pylon to be used in non-destructive testing to determine the presence of cracks therein.

Figure 6:
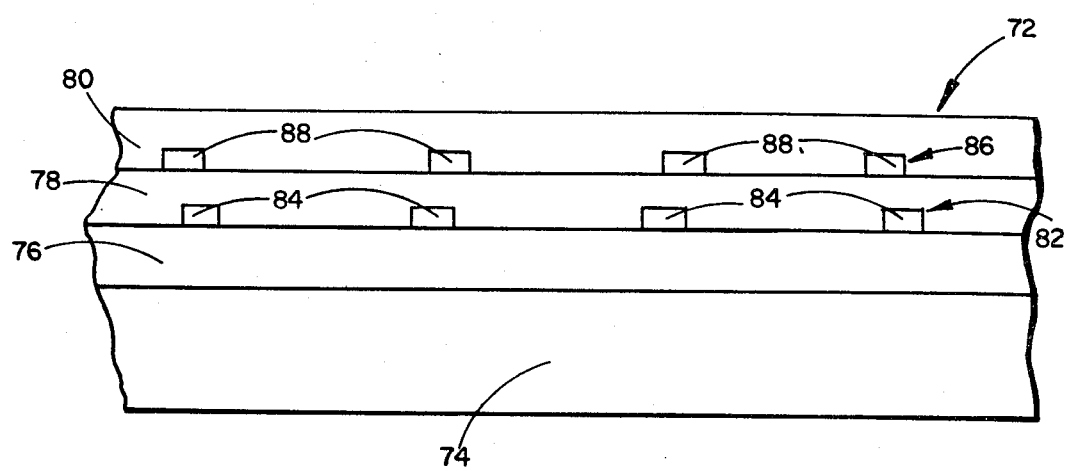
FIG. 6 is a cross-section view in elevation of a portion of a surface acoustic wave device wherein the fingers of an electrode of an acoustic wave transducer have a variable spacing.

In FIG. 6, there is shown a surface acoustic wave device 72 which resembles the device 42 of FIG. 4 in that it includes a substrate 74 on which are stacked, one above the other, three layers 76, 78 and 80, of piezoelectric material. An interdigital transducer is formed by a first electrode 82 having fingers 84 and a second electrode 86 having fingers 88. The first electrode 82 is sandwiched between the pair of layers 76 and 78 while the second electrode 86 is sandwiched between the pair of layers 78 and 80. The two transducer electrodes 82 and 86 are thus also positioned in a stack, one above the other. The spacing of the fingers 84 of the first electrode 82 has a uniform periodicity. To this extent, the electrode 82 is similar to the electrode 51 of the acoustic wave device 42 of FIG. 4. However, there is an important difference between the electrode 86 of acoustic wave device 72 and the electrode 53 of acoustic wave device 42. The spacing of the fingers 88 of electrode 86 is aperiodic in that the distance between the fingers 88 decreases uniformly from left to right in FIG. 6. It follows that the positioning of the fingers 88 of electrode 86 relative to the fingers 84 of electrode 82 is neither symmetrical nor even constant. The positioning or phase displacement of a finger 88 relative to its two nearest neighbor fingers 84 of electrode 82 varies along the length of the interdigital transducer. This high degree of flexibility in transducer design is made possible by the stacking of electrodes 82 and 86 with layers 76, 78 and 80.

In each of the embodiments discussed thus far, the interdigital transducers consist of only two electrodes or electrode elements. However, this is not a necessary limitation. An interdigital transducer for an acoustic wave device in accord with this invention may have any desired number of electrode elements arranged in a multi-layer stack. Each electrode element may be insulated from the other electrode elements by one or more layers of piezoelectric material. The spacing of the fingers of each electrode element may have any desired periodicity, the spacing may be aperiodic or it may even be random. The spacing selected for the fingers of any one electrode element is independent of the spacing selected for the other electrode elements in the transducer. Furthermore, the positioning or phase displacement of the fingers of one electrode relative to the fingers of any other electrode may be constant or variable, as desired. Such flexibility in transducer design is desirable for use in exciting a certain desired acoustic wave mode which may be, for example, a Rayleigh wave, a Love wave or a Sezawa wave. This transducer design flexibility is also advantageous for causing the transducer to have a particular desired frequency characteristic and impulse response.

Figure 7:
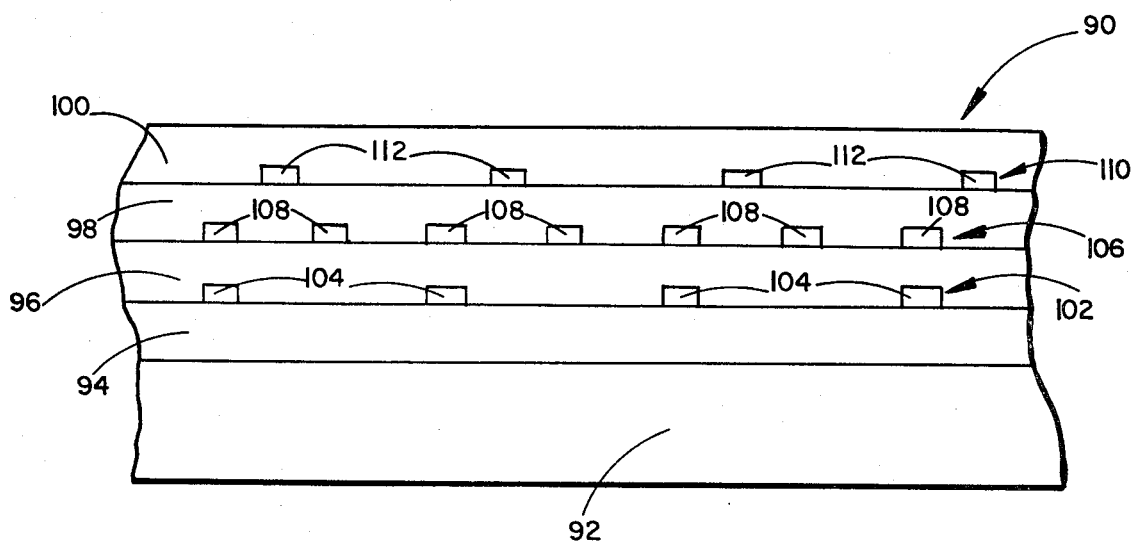
FIG. 7 is a cross-section view in elevation of a portion of a surface acoustic wave device in accord with the invention having more than two electrode elements.

The example of an acoustic wave device 90 chosen for illustration in FIG. 7 was selected to illustrate some of the points discussed in the paragraph immediately above. On a substrate 92 are stacked, one above the other, four layers 94, 96, 98 and 100, of piezoelectric material. An interdigital transducer is formed by a first electrode element 102 having fingers 104, a second electrode element 106 having fingers 108, and a third electrode element 110 having fingers 112. The first electrode element 102 is interposed between the pair of layers 94 and 96. The second electrode element 106 is interposed between the pair of layers 96 and 98. The third electrode element 110 is interposed between the pair of layers 98 and 100. The three electrode elements 102, 106 and 110 are positioned in a stack, one above the other. In this example, the spacing of the fingers of each of the electrode elements has a uniform periodicity. The spacing for the fingers 104 of electrode element 102 is the same as the spacing for the fingers 112 of electrode element 110. However, the spacing for the fingers 108 of electrode element 106 is half that of the fingers 104 and 112 of electrode elements 102 and 110, respectively. Every alternate finger 108 of electrode element 106 completely overlaps a finger 104 of electrode element 102.

Figure 8:
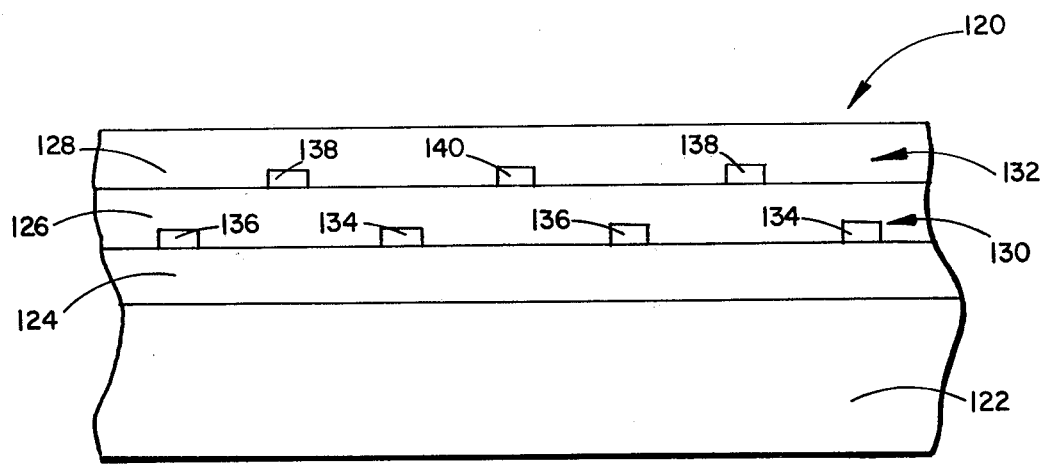
FIG. 8 is a cross-section view in elevation of a portion of a surface acoustic wave device having a four-phase interdigital transducer.

FIG. 8 shows a surface acoustic wave device 120 which includes a substrate 122 and a stack of three layers, 124, 126 and 128, of piezoelectric material. A multiple-phase (in this case, a four-phase) interdigital surface acoustic wave transducer is formed by a first pair 130 of interdigitated electrodes embedded between the layers 124 and 126 and a second pair of interdigitated electrodes 132 embedded between the layers 126 and 128. Thus, there are four electrodes in all. The first pair of electrodes 130 includes a first electrode having a plurality of spaced-apart fingers 134 and a second electrode having a plurality of spaced-apart fingers 136. The fingers 134 and 136 are interdigitated. The spacing between electrode fingers 134 has a uniform or constant periodicity while the spacing between the electrode fingers 136 has the same uniform periodicity. Furthermore, each of the set of fingers 134 is symmetrically positioned to be equidistant from its two nearest neighbors in the set of fingers 136. Thus the phase displacement between the two sets of fingers 134 and 136 is constant.

The second pair of electrodes 132 resembles the first pair of electrodes 130 in that the second pair of electrodes 132 includes a third electrode having a plurality of spaced-apart fingers 138 and fourth electrode having a plurality of spaced-apart fingers 140. The fingers 138 and 140 are interdigitated with each other. The spacing between electrode fingers 138 has a uniform or constant periodicity while the spacing between the electrode fingers 140 has the same uniform periodicity. This spacing periodicity for the electrode fingers 138 and 140 is the same as the spacing periodicity for the electrode fingers 134 and 136 in electrode pair 130. Each of the set of fingers 135 is symmetrically positioned to be equidistant from its two nearest neighbors in the set of fingers 140. Thus the phase displacement between the two sets of fingers 138 and 140 in electrode pair 132 is also constant.

Thus it is seen that each of the two pairs of electrodes shown in FIG. 8, electrode pairs 130 and 132, respectively, independently corresponds to a typical bidirectional interdigital transducer such as the interdigital transducer 12 of FIGS. 1 and 2. However, each electrode finger 134, 136, 138 or 140 of one pair of electrodes 130 or 132 is symmetrically positioned to be equidistant from its two nearest neighbors in the other pair of electrodes 132 or 130. For example, each finger 134 in electrode pair 130 is symmetrically positioned to be equidistant from its nearest neighbor fingers 138 and 140 in electrode pair 132. Thus, the pair of electrodes 130 has a phase displacement of ninety degrees with respect to the pair of electrodes 132. At the appropriate frequency, each electrode finger of one pair of electrodes is one-quarter of a wavelength displaced from its two nearest neighbor fingers in the other pair of electrodes. To operate the pairs of electrodes 130 and 132 as a single, four-phase, unidirectional surface acoustic wave transducer, the pair of electrodes 130 is driven by a signal which is ninety degrees out of phase with the signal driving the pair of electrodes 132. When this is appropriately done, substantially all of the acoustic energy propagates unidirectionally out of the region on the device 120 occupied by the transducer.

Figure 9:
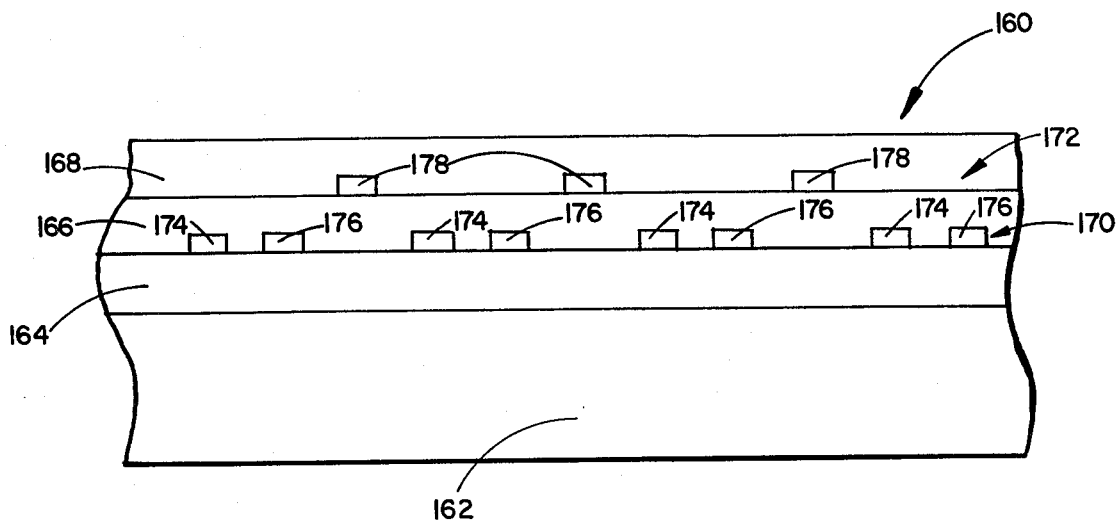
FIG. 9 is a cross-section view in elevation of a portion of a surface acoustic wave device having a three-phase interdigital transducer.

FIG. 9 shows a surface acoustic wave device 160 which includes a substrate 162 and a stack of three layers, 164, 166 and 168, of piezoelectric material. A multiple-phase (in this case, a three-phase) interdigital surface acoustic wave transducer is formed by a pair 170 of interdigitated electrodes embedded between the layers 164 and 166 and a third electrode 172 embedded between the layers 166 and 168. Thus, there are three electrodes in all. The pair of electrodes 170 includes a first electrode having a plurality of spaced-apart fingers 174 and a second electrode having a plurality of spaced-apart fingers 176. The fingers 174 and 176 are interdigitated. The spacing between electrode fingers 174 has a uniform or constant periodicity while the spacing between the electrode fingers has the same uniform periodicity. Thus the phase displacement between the two sets of fingers 174 and 176 is constant. As shown in FIG. 9, each electrode finger 176 is closer to the electrode finger 174 to the left than it is to the electrode finger 174 to the right. At the synchronous frequency for the three-phase transducer of device 160, the phase displacement between a finger 174 and the finger 176 to the right of it is selected to be one-hundred-twenty degrees. This is a spacing of one-third of an acoustic wavelength.

The third electrode 172 has a plurality of spaced-apart fingers 178. The spacing between electrode fingers 178 has the same uniform or constant periodicity as the spacing between electrode fingers 174 or 176. Each electrode finger 178 is spaced apart from its two nearest neighbor finger electrodes 174 and 176 by one third of an acoustic wavelength at the synchronous signal frequency. This spacing corresponds to a phase displacement of one-hundred-twenty degrees. To operate the pair of electrodes 170 together with the third electrode 172 as a single, three-phase, unidirectional surface acoustic wave transducer, each of the three electrodes is appropriately connected to a three-phase signal source. When this is done, substantially all of the acoustic energy propagates unidirectionally out of the region on the device 160 occupied by the transducer.

While the invention has been shown and described with reference to certain preferred embodiments thereof, it will be understood by those skilled in the art that various changes in details may be made therein without departing from the spirit and scope of the invention as set forth in the following claims.

What is claimed is:

1. An acoustic wave device, comprising:
    a substrate;
    a first layer of piezoelectric material disposed on said substrate;
    a first electrode for an interdigital acoustic wave transducer disposed on said first layer; and
    a second layer of piezoelectric material disposed over said first layer of piezoelectric material and said first electrode,
    whereby said first electrode is interposed between said first and second layers of piezoelectric material.

2. The acoustic wave device set forth in claim 1, further comprising a second electrode for said interdigital acoustic wave transducer disposed on said first layer of piezoelectric material and covered by said second layer of piezoelectric material whereby said second electrode is interposed between said first and second layers of piezoelectric material.

3. The acoustic wave device set forth in claim 1, further comprising:
    a second electrode for said interdigital acoustic wave transducer disposed on said second layer of piezoelectric material; and
    a third layer of piezoelectric material disposed over said second layer of piezoelectric material and said second electrode,
    whereby said second electrode is interposed between said second and third layers of piezoelectric material.

4. The acoustic wave device set forth in claim 3, wherein the distances between each finger of said first electrode and its two nearest neighbor fingers of said second electrode are unequal.

5. The acoustic wave device set forth in claim 4 wherein said distances are selected to cause the operation of said transducer to be substantially unidirectional.

6. The acoustic wave device set forth in claim 3, wherein the periodicity of the spacing of the fingers of said first electrode is different from the periodicity of the spacing of the fingers of said second electrode.

7. The acoustic wave device set forth in claim 3, wherein the spacing of the fingers of at least one of said first and second electrodes is aperiodic.

8. The acoustic wave device set forth in claim 1, wherein said substrate is of dielectric material, semiconductor material, plastic material or metal.

9. The acoustic wave device set forth in claim 3, wherein said acoustic wave transducer has a plurality of electrodes disposed with appropriate spacing between their respective electrode fingers for operation as a unidirectional, multiple-phase, surface acoustic wave transducer.

10. The acoustic wave device set forth in claim 1, wherein said first and second layers of piezoelectric material are of piezoelectric zinc oxide, cadmium sulfide, lithium niobate, lead-zirconium-titanate or polyvinyladine fluoride.

11. An acoustic wave device, comprising:
   a substrate;
   a plurality of layers of piezoelectric material disposed on said substrate and stacked on each other;
   a plurality of electrodes for an acoustic wave transducer, wherein each of said electrodes is embedded between a pair of said plurality of layers of piezoelectric material.

12. The acoustic wave device set forth in claim 11, wherein first and second electrodes for said acoustic wave transducer are interposed between different pairs of said plurality of layers of piezoelectric material.

13. The acoustic wave device set forth in claim 12, wherein fingers of said first and second electrodes are insulated from each other and overlap each other.

14. The acoustic wave device set forth in claim 11, wherein said plurality of electrodes are disposed with appropriate spacing between their respective electrode fingers for operation as a unidirectional multiple-phase, surface acoustic wave transducer.

15. A method of fabricating an acoustic wave device, comprising the steps of:
   providing a substrate;
   disposing a first layer of piezoelectric material on said substrate;
   disposing a first electrode for an interdigital acoustic wave transducer on said first layer of piezoelectric material; and
   covering said first layer of piezoelectric material and said first electrode with a second layer of piezoelectric material.

16. The method recited in claim 15, further comprising the steps of:
   disposing a second electrode for said interdigital acoustic wave transducer on said second layer of piezoelectric material; and
   covering said second layer of piezoelectric material and said second electrode with a third layer of piezoelectric material.

17. The method recited in claim 16, further comprising the step of selecting a first spacing for the fingers of said first electrode and a second spacing for the fingers of said second electrode wherein said first and second spacing patterns are different from each other thereby causing overlap of at least one finger of said first electrode and at least one finger of said second electrode.

18. The method recited in claim 15, further comprising the step of:
   disposing a third electrode for said interdigital acoustic wave transducer between a pair of said layers of piezoelectric material; and
   selecting a spacing for the respective electrode fingers of said electrodes wherein said spacing is appropriate for operating said electrodes as a unidirectional, multiple-phase, surface acoustic wave transducer.

* * * * *